United States Patent [19]

Kusaba

[11] Patent Number: 6,081,138
[45] Date of Patent: Jun. 27, 2000

[54] HIGH-SPEED SENSE AMPLIFIER

[75] Inventor: Susumu Kusaba, Tokyo, Japan

[73] Assignee: Oki Electric Industry Co., Ltd., Tokyo, Japan

[21] Appl. No.: 09/037,425

[22] Filed: Mar. 10, 1998

[30] Foreign Application Priority Data

Mar. 14, 1997 [JP] Japan .................................. 9-060445

[51] Int. Cl.[7] .............................................. G11C 11/40
[52] U.S. Cl. ........................................... 327/55; 365/208
[58] Field of Search ................................. 327/51, 52, 54, 327/55, 57, 91, 94, 95, 96; 365/190, 203, 205, 207, 208

[56] References Cited

U.S. PATENT DOCUMENTS

| | | | |
|---|---|---|---|
| 5,391,949 | 2/1995 | Vinal | 327/53 |
| 5,485,430 | 1/1996 | McClure | 327/51 |
| 5,528,545 | 6/1996 | Takahashi et al. | 327/51 |
| 5,568,438 | 10/1996 | Penchuk | 327/54 |
| 5,604,451 | 2/1997 | Sakata | 327/51 |
| 5,619,467 | 4/1997 | Sim | 327/55 |
| 5,646,905 | 7/1997 | Pogrebnoy | 365/233 |
| 5,668,765 | 9/1997 | Ang | 327/57 |

FOREIGN PATENT DOCUMENTS

| | | | |
|---|---|---|---|
| 0 747 903 | 12/1996 | European Pat. Off. | G11C 11/00 |
| 4-38793 | 2/1992 | Japan | G11C 11/34 |
| 2 302 193 | 1/1997 | United Kingdom | G11C 7/06 |

OTHER PUBLICATIONS

Susumu Kusaba, "Semiconductor Integrated Circuit Device" Japan Institute of Invention and Innovation Journal of Technical Discloser, Jan. 17, 1994 and English translation.

Primary Examiner—Timothy P. Callahan
Assistant Examiner—Terry L. Englund
Attorney, Agent, or Firm—Jones Volentine, LLP

[57] ABSTRACT

When a sense amplifier enable signal EN is taken "H", NMOSs are turned ON so that the sense amplifier is activated. When a data signal Sda is taken "H" and a data signal Sdb is taken "L", a node NA goes "H" and a node NB goes "L". The potentials of the respective sources of the NMOSs, i.e., potential levels at nodes NC and ND are respectively independently varied according to respective currents carried by the data signals Sda and Sdb and their levels. Therefore, the potential level at the node ND is brought to a ground level and the potential level at the node NB is brought closer to the ground level. Correspondingly, the potential level at the node NA becomes higher. The potential level at the node NA is outputted to an output terminal OUTa through an inverter comprised of a PMOS and an NMOS. Similarly, the potential level at the node NB is outputted to an output terminal OUTB through another inverter comprised of a PMOS and an NMOS.

9 Claims, 2 Drawing Sheets

HIGH-SPEED SENSE AMPLIFIER

BACKGROUND OF THE INVENTION

1. Field of the Invention

This invention relates to a current-driven sense amplifier suitable for use in, for example, a static random access memory (SRAM) or the like.

2. Description of the Related Art

As a sense amplifier for amplifying data signals outputted from a memory cell while power consumption is being cut back, one is known which uses one switch circuit to thereby drive a first circuit for detecting a first data signal and a second circuit for,detecting a second data signal complementary to the first data signal.

SUMMARY OF THE INVENTION

An object of the present invention is to provide a high-speed operated sense amplifier capable of converting potentials at nodes to which data signals inputted to the sense amplifier are transmitted, into higher or lower levels quicker respectively.

According to one aspect of the invention, for achieving the above object, there is provided a sense amplifier suitable for use in a semiconductor memory device, which includes the following first construction comprising:

a first data line to which a first data signal is transmitted;

a second data line to which a second data signal complementary to the first data signal is transmitted;

a sense amplifier unit having a first amplifier circuit for outputting a first amplified signal (corresponding to a signal) obtained by amplifying the first data signal and a second amplifier circuit for outputting a second amplified signal (corresponding to a signal) obtained by amplifying the second data signal;

a first inverter circuit for inverting the first amplified signal to thereby output a first inverted signal from a first output terminal;

a second inverter circuit for inverting the second amplified signal to thereby output a second inverted signal from a second output terminal;

a first sense amplifier driving switch circuit controlled by a sense amplifier enable signal and activated so as to drive the first amplifier circuit; and a second sense amplifier driving switch circuit controlled by the sense amplifier enable signal and activated so as to drive the second amplifier circuit.

According to another aspect of the invention, for achieving the above object, there is provided a sense amplifier suitable for use in a semiconductor memory device, which includes the following first construction comprising:

a first data line to which a first data signal is transmitted;

a second data line to which a second data signal complementary to the first data signal is transmitted;

a sense amplifier unit having a first amplifier circuit for outputting a first amplified signal (corresponding to a signal) obtained by amplifying the first data signal and a second amplifier circuit for outputting a second amplified signal (corresponding to a signal) obtained by amplifying the second data signal;

a first inverter circuit for inverting the first amplified signal to thereby output a first inverted signal from a first output terminal;

a second inverter circuit for inverting the second amplified signal to thereby output a second inverted signal from a second output terminal; and a sense amplifier driving switch circuit controlled by an equalize signal and activated so as to drive the first and second amplifier circuits.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
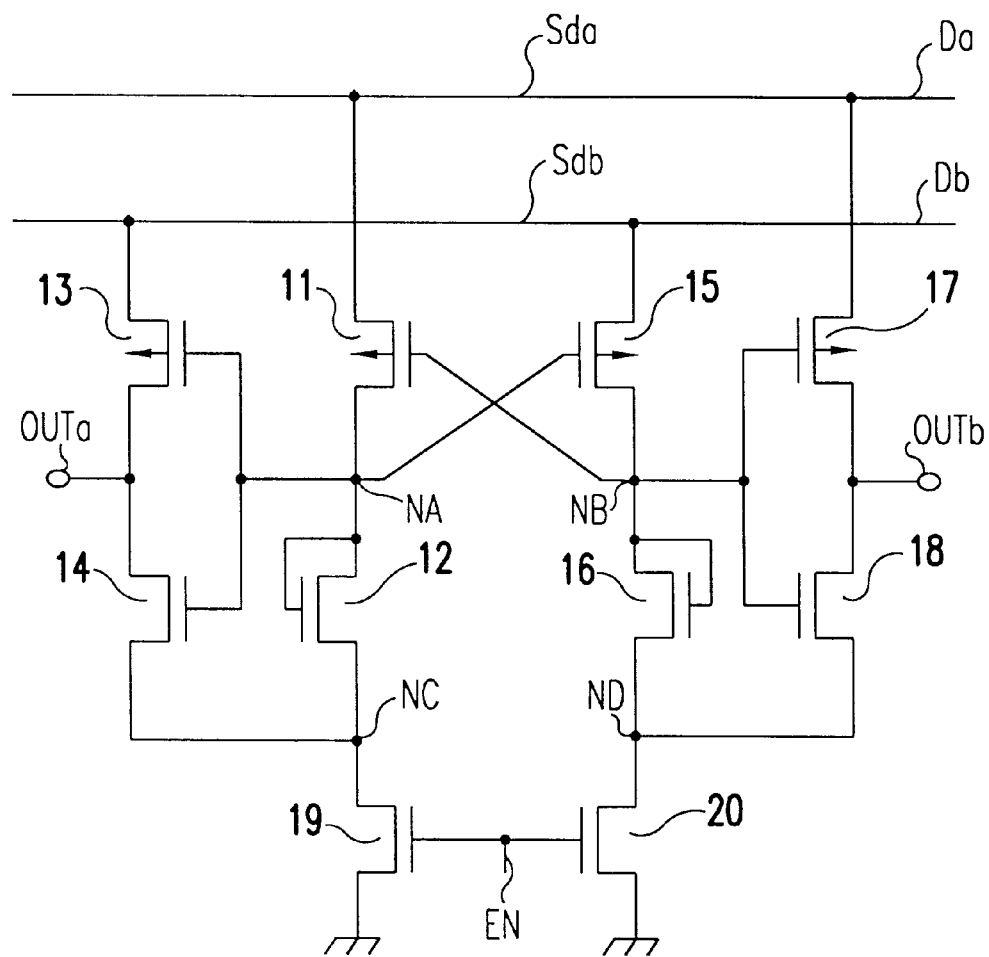
FIG. 1 shows a first embodiment of a sense amplifier according to the present invention.

FIG. 1 is a circuit diagram of a sense amplifier showing a first embodiment of the present invention.

The sense amplifier has a first conduction type first transistor (for example, PMOS) 11. A first electrode (for example, source) of the PMOS 11 is electrically connected to a first data line Da. A first data signal Sda is transmitted from an unillustrated memory cell to the first data line Da. A second electrode (for example, drain) of the PMOS 11 is electrically connected to a first node NA. The gate of the PMOS 11 is electrically connected to a second node NB. The PMOS 11 has the function of transmitting the level of the first data signal Sda to the first node NA when the state of continuity or conduction between the source and drain of the PMOS 11 is brought to an ON state by being controlled based on a potential level at the second node NB. The first node NA is electrically connected to a first electrode (for example, drain) of an NMOS 12 serving as a first resistive circuit and the gate thereof. A second electrode (for example, source) of the NMOS 12 is electrically connected to a third node NC. The NMOS 12 has the function of setting a potential level at the first node NA.

The first node NA is electrically connected to the gate of a first conduction type second transistor (for example, PMOS) 13 and the gate of a second conduction type third transistor (for example, NMOS) 14. The source of the PMOS 13 is electrically connected to a second data line Db and the drain thereof is electrically connected to a first output terminal OUTa and the drain of the NMOS 14. A second data signal Sdb complementary to the first data signal Sda is transmitted from the unillustrated memory cell to the second data line Db. The PMOS 13 has the function of outputting the level of the second data signal Sdb to the output terminal OUTa when the state of conduction between the source and drain of the PMOS 13 is brought to an ON state by being controlled based on the potential level of the first node NA. The source of the NMOS 14 is electrically connected to the third node NC. The NMOS 14 has the function of outputting a potential level at the third node NC to the output terminal OUTa when the state of conduction between the drain and source of the NMOS 14 is brought to an ON state by being controlled based on the potential level of the first node NA.

Further, the first node NA is electrically connected to the gate of a first conduction type fourth transistor (for example, PMOS) 15. The source of the PMOS 15 is electrically connected to the second data line Db. The drain of the PMOS 15 is electrically connected via the second node NB to the drain and gate of the NMOS 16 which serves as a second resistive circuit. The PMOS 15 has the function of transmitting the level of the second data signal Sdb to the second node NB when the state of conduction between the source and drain of the PMOS 15 is brought to an ON state by being controlled based on the potential level of the first node NA. The source of the NMOS 16 is electrically connected to a fourth node ND. The NMOS 16 has the function of setting the potential level at the second node NB.

The second node NB is electrically connected to the gate of a first conduction type fifth transistor (for example, PMOS) 17 and the gate of a second conduction type sixth transistor (for example, NMOS) 18. The source of the PMOS 17 is electrically connected to the first data line Da and the drain thereof is electrically connected to an output terminal OUTb and the drain of the NMOS 18. The source of the NMOS 18 is electrically connected to the fourth node ND. The PMOS 17 has the function of outputting the level of the first data signal Sda to the output terminal OUTb when the state of conduction between the source and drain of the PMOS 17 is brought to an ON state by being controlled based on the potential level at the second node NB. Further, the NMOS 18 has the function of outputting a potential level at the fourth node ND to the output terminal OUTb when the state of conduction between the drain and source of the NMOS 18 is brought to an ON state by being controlled based on the potential level at the second node NB.

The third node NC is electrically connected to the drain of a second conduction type seventh transistor (for example, NMOS) 19 and the source of the NMOS 19 is electrically tied to a ground potential. The fourth node ND is electrically connected to the drain of a second conduction type eighth transistor NMOS 20 and the source of the NMOS 20 is electrically tied to the ground potential. A sense amplifier enable signal EN is inputted to the gates of the NMOSs 19 and 20. These NMOSs 19 and 20 are constructed in such a manner that the states of conduction between the drain and source of the NMOS 19 and between the drain and source of the NMOS 20 are respectively controlled based on the sense amplifier enable signal EN.

The operation of the sense amplifier showing the first embodiment of the present invention will next be explained.

The activity and inactivity of a signal level are respectively represented as "H" and "L" from the present embodiment up.

When the sense amplifier enable signal EN goes active, the NMOSs 19 and 20 are turned ON so that the present sense amplifier is activated. Now consider where, for example, the first data signal Sda is taken "H" and the second data signal Sdb is taken "L". At this time, a difference in current, which corresponds to a memory cell current Δi alone, is produced between the first data signal Sda and the second data signal Sdb. Owing to the current difference Δi, the first node NA goes "H" and the second node NB goes "L". Since the NMOSs 19 and 20 are separated from each other, the potentials applied to the sources of the NMOSs 12 and 16, i.e., the potential levels at the third and fourth nodes NC and ND are respectively independently varied according to respective currents carried by the first and second data signals Sda and Sdb and their levels. Therefore, the potential level at the fourth node ND results in the ground potential level and hence the potential level at the second node NB becomes lower. When the potential level at the second node NB is further reduced, the PMOS 11 is rendered more active so that the potential level at the first node NA is brought to a higher level.

The potential level at the first node NA is inverted and converted into a predetermined logical value level by an inverter comprised of the PMOS 13 and the NMOS 14. Thereafter, the converted logical value level is outputted from the output terminal OUTa as an output signal Souta. Similarly, the potential level at the second node NB is reversed and converted into a predetermined logical value level by an inverter comprised of the PMOS 17 and the NMOS 18, after which the converted level is outputted from the output terminal OUTb as an output signal Soutb. Now, the source of the PMOS 13 is electrically connected to the second data line Db supplied with the second data signal Sdb brought to the "L". Therefore, since the threshold voltage on the input side, of the inverter comprised of the PMOS 13 and the NMOS 14 becomes low, the inverter performs quicker and stabler potential level conversion when the potential level at the first node NA is taken "H". Similarly, the source of the PMOS 17 is electrically connected to the first data line Da supplied with the first data signal Sda taken "H". Therefore, since the threshold voltage on the input side, of the inverter becomes high, the inverter comprised of the PMOS 17 and the NMOS 18 performs quicker and stabler potential level conversion when the second node NB is brought to the "L". Accordingly, the output signals Souta and Soutb of the sense amplifier make transitions to potential levels of "L" and "H" quicker respectively. Further, since the sense amplifier enable signal EN is taken "L" when the sense amplifier is on standby, for example, the NMOSs 19 and 20 are turned OFF to deactivate the sense amplifier.

In the first embodiment as has been described above, the respective potential levels at the third and fourth nodes NC and ND are respectively independently varied by separating the NMOS 19 and the NMOS 20 from one another. Therefore, when the first and second nodes NA and NB are taken "H", the respective potential levels at the first and second nodes NA and NB become higher, whereas when the first and second nodes NA and NB are taken "L", the respective potential levels at the first and second nodes NA and NB become lower. Thus, the logical value levels of the output signals Souta and Soutb change quicker.

Figure 2:
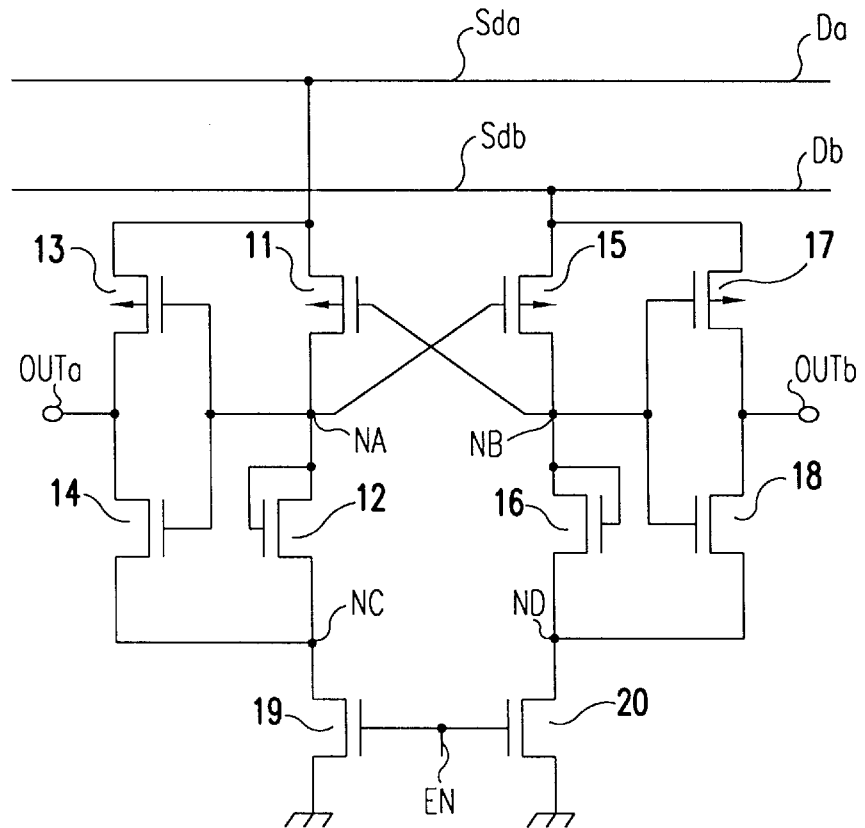
FIG. 2 illustrates a second embodiment of a sense amplifier according to the present invention.

FIG. 2 is a circuit diagram of a sense amplifier showing a second embodiment of the present invention. The same elements of structure as those shown in FIG. 1 illustrative of the first embodiment are identified by like reference numerals.

In the sense amplifier, the source of a PMOS 13 is electrically connected to a data line Da and the source of a PMOS 17 is electrically connected to a data line Db. The present sense amplifier is similar in other configurations to that shown in FIG. 1.

The operation of the sense amplifier shown in FIG. 2 is different from that shown in FIG. 1 in the following points.

Now consider the relationships before and after the transition of the level of a data signal Sda from "L" to "H" and the transition of the level of a data signal Sdb from "H" to "L", for example. At this time, output signals Souta and Soutb are respectively taken "H" and "L" and the levels thereof still remain unchanged immediately after these transitions. A potential level at a node NA will transition from "L" to "H" and a potential level at a node NB will make an H to L transition. Since the potential level at the node NA is "L" and the level of the output signal Souta is "H" at this time, much current flows by means of a PMOS 11. Therefore, the potential level at the node NA is transitioned to "H" quicker and becomes higher. Since the NMOSs 19 and 20 are separated from each other and the potential level at the node NA makes an "H" transition quicker and becomes higher, the potential level at the node NB makes an "L" transition faster and becomes lower. Thus, the output signals Souta and Soutb of the sense amplifier are changed to the "L" and "H" levels quicker respectively.

According to the second embodiment as described above, since the source of the PMOS 13 is electrically connected to the data line Da and the source of the PMOS 17 is electrically connected to the data line Db, the current that flows in the PMOS 11 electrically connected to the data line Da taken "H", or the current that flows in the PMOS 15 electrically connected to the data line Db taken "H" increases as compared with the first embodiment. Thus, the respective potential levels of the nodes NA and NB become higher than as compared with the first embodiment when the nodes are taken "H", whereas they become lower than as in the first embodiment when taken "L". As a result, the logical value levels of the output signals Souta and Soutb are faster than as compared with the first embodiment in transition. Namely, the operation of the sense amplifier is speeded up as compared with the first embodiment.

In the aforementioned embodiments, the first and second resistive circuits are made up of the NMOSs 12 and 16 whose drains and gates are respectively electrically connected to one another. However, they may be comprised of resistors or diodes respectively.

Figure 3:
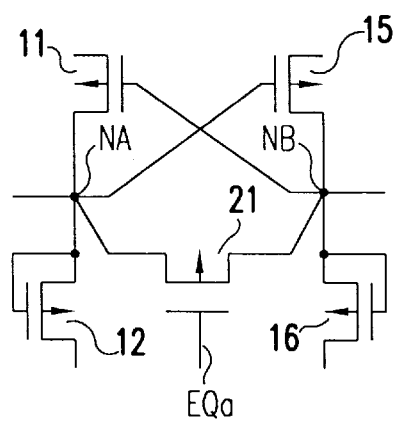
FIG. 3 depicts a modification of the first embodiment according to the present invention.
Figure 4:
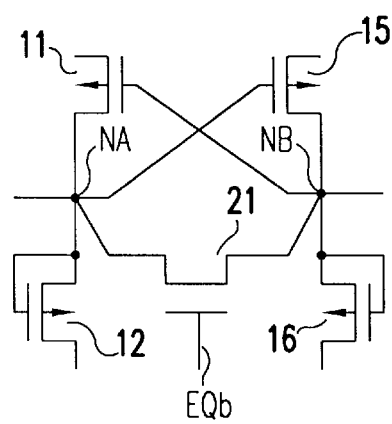
FIG. 4 shows a modification of the second embodiment according to the present invention.

FIGS. 3 and 4 are respectively circuit diagrams showing modifications of the first and second embodiments. Referring to FIG. 3, the source and drain of a PMOS 21 are respectively electrically connected between the nodes NA and NB in FIG. 1 or FIG. 2. Further, an equalize signal EQa is to be inputted to the gate of the PMOS 21. Referring also to FIG. 4, the drain and source of an NMOS 22 are respectively electrically connected between the nodes NA and NB and an equalize signal EQb is to be inputted to the gate of the NMOS 22.

During any given time before and after data signals Sda and Sdb change, the equalize signal EQa is taken "L" or the equalize signal EQb is taken "H" to thereby bring either the PMOS 21 or the NMOS 22 to an ON state, whereby the potential levels of the nodes NA and NB may be equalized to each other. Tnus, the potential levels of the nodes NA and NB change quicker so that the operation of the sense amplifier is further speeded up.

The sense amplifier according to the present invention can be applied to an overall memory circuit having a current-driven sense amplifier incorporated therein, which is activated by being supplied with the mutually-complementary first and second data signals outputted from the memory cell.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A sense amplifier suitable for use in a semiconductor memory device, comprising:

a first data line to which a first data signal is transmitted;

a second data line to which a second data signal complementary to the first data signal is transmitted;

a sense amplifier unit have a first amplifier circuit for outputting a first amplified signal obtained by amplifying the first data signal and a second amplifier circuit for outputting a second amplified signal obtained by amplifying the second data signal, wherein the first amplifier circuit has a first node and is coupled between the first data line and a third node, and wherein the second amplifier circuit has a second node and is coupled between the second data line and a fourth node;

a first sense amplifier driving switch circuit coupled between the third node and a ground potential;

a second sense amplifier driving switch circuit coupled between the fourth node and the ground potential;

a first inverter circuit for inverting the first amplified signal from the first node to thereby output a first inverted signal from a first output terminal, wherein said first inverter circuit is coupled between the third node and one of the first and second data lines;

a second inverter circuit for inverting the second amplified signal from the second node to thereby output a second inverted signal from a second output terminal, wherein said second inverter circuit is coupled between the fourth node and the other one of the first and second data lines;

the first sense amplifier driving switch circuit controlled by a sense amplifier enable signal and activated so as to drive said first amplifier circuit; and the second sense amplifier driving switch circuit controlled by the sense amplifier enable signal and activated so as to drive said second amplifier circuit.

2. A sense amplifier according to claim 1, wherein said first amplifier circuit comprises a first conduction type first switch circuit and a first resistive circuit, said first switch circuit having a first electrode electrically connected to said first data line, a second electrode electrically connected to a second electrode of said first resistive circuit through the first node, and a third electrode electrically connected to the second node, said first inverter circuit comprises a first conduction type second switch circuit and a second conduction type third switch circuit, said second switch circuit having a first electrode electrically connected to said second data line, a second electrode electrically connected to the first output terminal, and a third electrode electrically connected to the first node, said third switch circuit having a first electrode electrically connected to a first electrode of said first resistive circuit through the third node, a second electrode electrically connected to the first output terminal, and a third electrode electrically connected to the first node, said second amplifier circuit comprises a first conduction type fourth switch circuit and a second resistive circuit, said fourth switch circuit having a first electrode electrically connected to said second data line, a second electrode electrically connected to a second electrode of said second resistive circuit through the second node, and a third electrode electrically connected to the first node, said second inverter circuit comprises a first conduction type fifth switch circuit and a second conduction type sixth switch circuit, said fifth switch circuit having a first electrode electrically connected to said first data line, a second electrode electrically connected to the second output terminal, and a third electrode electrically connected to the second node, said sixth switch circuit having a first electrode electrically connected to a first electrode of said second resistive circuit through the fourth node, a second electrode electrically connected to the second output terminal, and a third electrode electrically connected to the second node, said first sense amplifier driving switch circuit is of the second conduction type and has a first electrode electrically connected to the ground potential, and a second electrode electrically connected to the third node, and said second sense amplifier driving switch circuit is of the second conduction type and has a first electrode electrically connected to the ground potential, and a second electrode electrically connected to the fourth node.

3. A sense amplifier according to claim 2 further comprising:

an equalizir circuit for equalizing an electric potential of said first node with an electric potential of said second node.

4. A sense amplifier according to claim 2 further comprising:

an equalizing circuit having a first electrode electrically connected to the first node, a second electrode electrically connected to the second node, and a third electrode electrically connected to a terminal for inputting an equalizing signal.

5. A sense amplifier according to claim 2 further comprising:

a first conduction type or second conduction type MOS transistor connected to both said first node and said second node.

6. A sense amplifier according to claim 1, wherein said first amplifier circuit comprises a first conduction type first switch circuit and a first resistive circuit, said first switch circuit having a first electrode electrically connected to said first data line, a second electrode electrically connected to a second electrode of said first resistive circuit through the first node, and a third electrode electrically connected to the second node, said first inverter circuit comprises a first conduction type second switch circuit and a second conduction type third switch circuit, said second switch circuit having a first electrode electrically connected to the first electrode of said first switch circuit, a second electrode electrically connected to the first output terminal, and a third electrode electrically connected to the first node, said third switch circuit having a first electrode electrically connected to a first electrode of said first resistive circuit through the third node, a second electrode electrically connected to the first output terminal, and a third electrode electrically connected to the first node, said second amplifier circuit comprises a first conduction type fourth switch circuit and a second resistive circuit, said fourth switch circuit having a first electrode electrically connected to said second data line, a second electrode electrically connected to a second electrode of said second resistive circuit through the second node, and a third electrode electrically connected to the first node, said second inverter circuit comprises a first conduction type fifth switch circuit and a second conduction type sixth switch circuit, said fifth switch circuit having a first electrode electrically connected to the first electrode of said fourth switch circuit, a second electrode electrically connected to the second output terminal, and a third electrode electrically connected to the second node, said sixth switch circuit having a first electrode electrically connected to a first electrode of said second resistive circuit through the fourth node, a second electrode electrically connected to the second output terminal, and a third electrode electrically connected to the second node, said first sense amplifier driving switch circuit is of the second conduction type and has a first electrode electrically connected to the ground potential, and a second electrode electrically connected to the third node, and said second sense amplifier driving switch circuit is of the second conduction type and has a first electrode electrically connected to the ground potential, and a second electrode electrically connected to the fourth node.

7. A sense amplifier according to claim 6 further comprising;

an equalizing circuit for equalizing an electric potential of said first node with an electric potential of said second node.

8. A sense amplifier according to claim 6 further comprising:

an equalizing circuit having a first electrode electrically connected to the first node, a second electrode electrically connected to the second node, and a third electrode electrically connected to a terminal for inputting an equalizing signal.

9. A sense amplifier according to claim 6 further comprising:

a first conduction type or second conduction type MOS transistor connected to both said first node and said second node.

* * * * *